(12) United States Patent
Lu

(10) Patent No.: US 7,215,127 B1
(45) Date of Patent: May 8, 2007

(54) DETECTING FIXTURE AND METHOD THEREOF FOR DETECTING CAPACITORS

(75) Inventor: Pei-Yen Lu, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/465,340

(22) Filed: Aug. 17, 2006

(30) Foreign Application Priority Data

Jan. 13, 2006 (TW) .............................. 95101430 A

(51) Int. Cl.
*G01R 31/06* (2006.01)
(52) U.S. Cl. .................................... 324/548; 324/76.66
(58) Field of Classification Search ................ 324/548, 324/76.66
See application file for complete search history.

(56) References Cited

U.S. PATENT DOCUMENTS 4,931,721 A * 6/1990 Berrigan et al. ............ 324/658
6,198,290 B1 * 3/2001 Krinker ....................... 324/548
6,211,684 B1 * 4/2001 McKee et al. .............. 324/548
6,781,401 B2 * 8/2004 Kim ........................... 324/769
7,084,638 B1 * 8/2006 Kramer et al. .............. 324/548

* cited by examiner

*Primary Examiner*—Walter Benson
(74) *Attorney, Agent, or Firm*—J.C. Patents

(57) ABSTRACT

A detecting fixture for detecting a capacitor with leakage current among a capacitor group in parallel connection includes a reference voltage generator, an impedance converter, a comparator and a display unit. Wherein, the reference voltage generator is used for outputting a first voltage, the impedance converter is used for converting the impedance of the capacitor group in parallel connection into a second voltage and the comparator is respectively coupled with the outputs of the reference voltage generator and the impedance converter for comparing the first voltage with the second voltage. The display unit is coupled with the output of the comparator, wherein the second voltage is altered by heating a capacitor among the capacitor group in parallel connection and the comparator outputs a voltage difference in response to the altered second voltage, so that the display unit is able to indicate whether or not the corresponding capacitor has leakage current.

17 Claims, 2 Drawing Sheets

DETECTING FIXTURE AND METHOD THEREOF FOR DETECTING CAPACITORS

CROSS-REFERENCE TO RELATED APPLICATION

This application claims the priority benefit of Taiwan application serial no. 95101430, filed Jan. 13, 2006. All disclosure of the Taiwan application is incorporated herein by reference.

BACKGROUND OF THE INVENTION

1. Field of Invention

The present invention relates to a detecting fixture and a detecting method, and more particularly, to a detecting fixture and a detecting method for detecting capacitors.

2. Description of the Related Art

A leakage current often occurs in a capacitor or a transistor. Usually, a circuit with leakage current suffers from an interference caused thereby for the normal operation thereof and fails to achieve the originally expected working status.

When a capacitor on a load board is out of order or is damaged, a leakage current will occur with the capacitor, and thus, the circuit operation is affected. During testing on a load board, if a symptom indicating a leakage current occurs with a capacitor, the maintenance personnel on duty usually locates the most likely defective capacitor among a capacitor group formed by multiple capacitors by means of his/her experience or guessing. Then, necessary meter measurements are taken to decide whether or not the targeted capacitor has fault. Since a targeted capacitor must be pulled out first for detecting with a multi-meter, therefore, it is very likely to damage the originally sound capacitor during pulling out the capacitor.

In order to provide a proper maintenance method to resolve the above-described problem, the present invention provides a novel detecting method and detecting fixture to shorten the entire time required for maintenance and analysis and to reduce the unnecessary damage caused by an erroneous action for removing a capacitor, so that an originally sound capacitor can be saved from damage and the real defective capacitor with leakage current can be located correctly.

SUMMARY OF THE INVENTION

An objective of the present invention is to provide a detecting fixture for detecting a capacitor with leakage current. Compared with the conventional detecting method where a potential risk to destroy a capacitor exists, the present invention not only needs not to pull out a capacitor from the load board, but also effectively tests a capacitor with leakage current.

Another objective of the present invention is to provide a method for detecting capacitor, which is able to effectively locate a capacitor with leakage current by using the detecting fixture to lighten the burden of circuit test personnel or maintenance personnel.

The detecting fixture of the present invention for locating a capacitor with leakage current among a capacitor group in parallel connection includes a reference voltage generator, an impedance converter, a comparator and a display unit. Wherein, the reference voltage generator is used for outputting a first voltage, while the impedance converter is used for converting the impedance of the capacitor group in parallel connection into a second voltage. The comparator is respectively coupled with the output of the reference voltage generator and the output of the impedance converter for comparing the first voltage with the second voltage. The display unit is coupled with the output of the comparator. As a capacitor in the capacitor group in parallel connection is heated, the second voltage would be changed and the comparator outputs a voltage difference in response to the changed second voltage, so as to enable the display unit to indicate whether or not the corresponding capacitor has leakage current.

In an embodiment of the present invention, the reference voltage generator has a first voltage divider, the impedance converter has a second voltage divider and the first voltage divider and the second voltage divider together form an electrical bridge, wherein the first voltage divider has a variable resistor for adjusting the first voltage. In addition, the display unit has an operation amplifier which is coupled with the output of the comparator and is able to produce a negative voltage output in response to a voltage difference. Meanwhile, the display unit further has a light-emitting diode (LED), wherein the anode thereof is grounded, while the cathode thereof is coupled with the negative voltage output.

In an embodiment of the present invention, the detecting fixture further includes a calibration voltage generator coupled with the input terminal of the operation amplifier for producing a calibration voltage. Besides, the calibration voltage generator has a variable resistor for adjusting the calibration voltage. Furthermore, the detecting fixture of the present invention includes a switch for connecting the variable resistor to the input terminal of the operation amplifier.

The present invention further provides a method for detecting capacitor. The method includes the following steps. First, a first voltage is produced. Next, the impedance of the capacitor group in parallel connection is converted into a second voltage output to the comparator. Afterwards, the comparator receives the first voltage and the second voltage, and outputs a comparison result to the display unit. Finally, a capacitor in the capacitor group in parallel connection is heated to change the second voltage, while the comparator outputs a voltage difference in response to the changed second voltage, so as to enable the display unit to indicate whether or not the corresponding capacitor has leakage current.

In an embodiment of the present invention, the first voltage and the second voltage are respectively formed by a dividing voltage of the electrical bridge, where the first voltage is regulated by adjusting the variable resistor. Note that the display unit uses the operation amplifier to receive the voltage difference and produce a corresponding negative voltage for output, while the LED is coupled with the negative voltage output to indicate whether or not the capacitor has leakage current.

In an embodiment of the present invention, the operation amplifier used by the method for detecting capacitor is able to employ a variable resistor to calibrate the voltage at the positive input terminal thereof, wherein the variable resistor is coupled with the input terminal of the operation amplifier via a switch.

It can be seen from the above described that since the present invention uses the circuit behaviors of the comparator, the LED and the operation amplifier in cooperation with the employed reference voltage generator and calibration voltage generator, the detecting fixture of the present invention is able to effectively find out the malfunction of a capacitor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

For a capacitor usually formed by multiple dielectric layers, if leakage current therewith occurs in a high-temperature environment, the electron drift velocity between the dielectric layers would be faster than the one with a normal capacitor, which makes the impedance value of the defective capacitor become significantly low. Taking advantage of the characteristic of the capacitor with leakage current, the present invention is able to locate the capacitor with leakage current by viewing whether or not the LED lightens.

Figure 1:
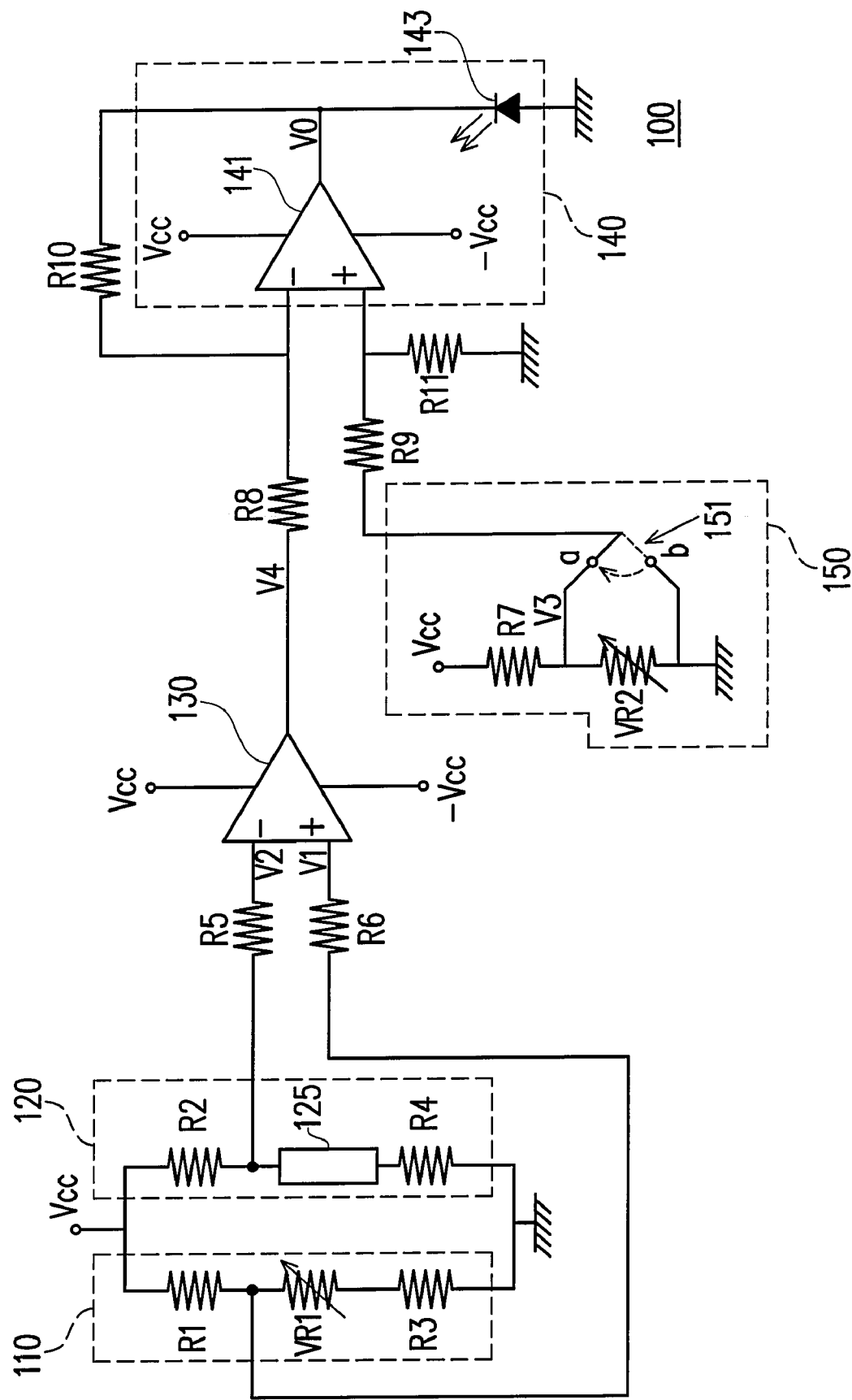
FIG. 1 is a circuit architecture drawing of a detecting fixture according to an embodiment of the present invention.

FIG. 1 is a circuit architecture drawing of a detecting fixture according to an embodiment of the present invention. Referring to FIG. 1, the detecting fixture 100 for finding out a capacitor with leakage current among the capacitor group in parallel connection in the embodiment of the present invention includes a reference voltage generator 110, an impedance converter 120, a comparator 130 and a display unit 140. Wherein, the reference voltage generator 110, the impedance converter 120, the comparator 130 and the display unit 140 are coupled with a voltage source Vcc. The reference voltage generator 110 is for outputting a voltage V1 and the impedance converter 120 is for converting the impedance of a capacitor group in parallel connection into a voltage V2. The positive input terminal of the comparator 130 is coupled with the voltage V1 output from the reference voltage generator 110 and the negative input terminal thereof is coupled with the voltage V2 output from the impedance converter 120 for comparing the voltage V1 with the voltage V2. The display unit 140 is coupled with the output of the comparator 130, wherein the voltage V2 can be changed by heating a capacitor among the capacitor group in parallel connection as an object under test 125, while the comparator 130 outputs a voltage difference in response to the altered voltage V2, so as to enable the display unit 140 to indicate whether or not the heated capacitor has leakage current. Besides, the positive input terminal of the comparator 130 is coupled with a resistor R6 and the negative input terminal of the comparator 130 is coupled with a resistor R5, wherein the resistors R5 and R6 are disposed for current-limiting to protect the positive/negative input terminal of the comparator 130.

In an embodiment of the present invention, the reference voltage generator 110 has a voltage divider formed by a resistor R1, a resistor R3 and a variable resistor VR1, the impedance converter 120 has a voltage divider formed by a resistor R2, a resistor R4 and the object under test 125, and the above-described two voltage dividers form an electrical bridge. The display unit 140 has an operation amplifier 141, which is coupled with the output of the comparator 130, and the operation amplifier 141 is able to produce a negative output voltage Vo in response to the voltage difference. The display unit 140 further has an LED 143, wherein the anode of the LED 143 is grounded, while the cathode thereof is coupled with the negative output voltage Vo.

In an embodiment of the present invention, the detecting fixture 100 further includes a calibration voltage generator 150 coupled with the positive input terminal of the operation amplifier 141 for the calibration voltage generator 150 to produce a calibration voltage V3. The calibration voltage generator 150 includes a resistor R7, a variable resistor VR2 and a switch 151, which is able to be shifted at the terminal 'a' or 'b' to connect the positive input terminal of the operation amplifier 141 for coupling the variable resistor VR2 with the positive input terminal of the operation amplifier 141. Besides, the variable resistor VR2 also serves for adjusting the value of the calibration voltage V3, while an end of the resistor R7 is coupled with the voltage source Vcc.

Figure 2:
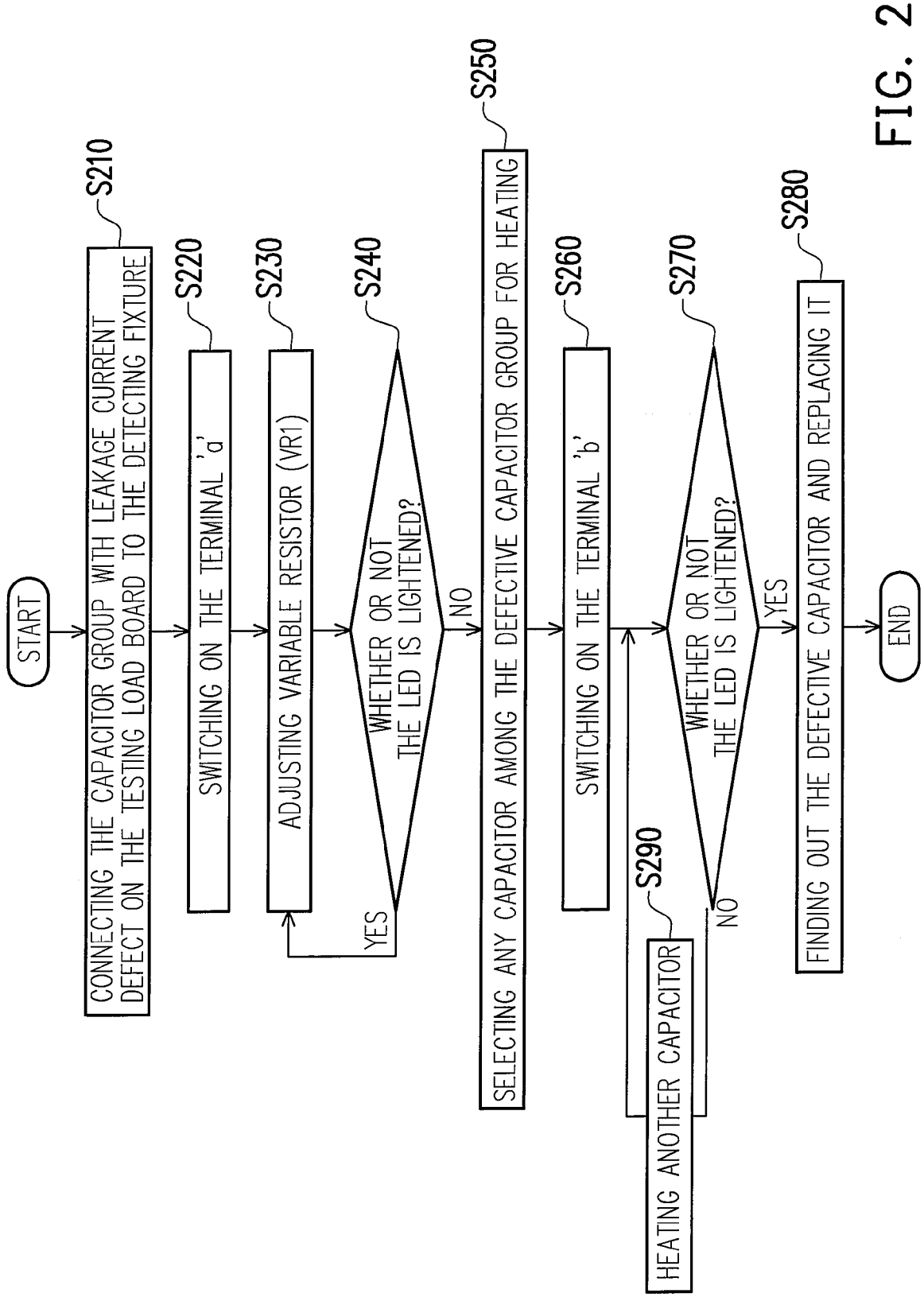
FIG. 2 is a method flowchart for detecting capacitors according to an embodiment of the present invention.

FIG. 2 is a method flowchart for detecting capacitors according to an embodiment of the present invention. Referring to FIGS. 1 and 2, the method for detecting capacitors provided by the present invention includes the following steps. First, in step S210, a capacitor group with leakage current on a testing load board is connected between both ends prepared for an object under test 125, the resistance value of the variable resistor VR1 is adjusted to the maximum extent for producing a voltage V1, and the impedance of the capacitor group in parallel connection in the object under tested 125 is converted into a voltage V2. Meanwhile, the voltage V2 is output to the comparator 130, which receives both the voltage V1 and the voltage V2 and outputs a voltage V4 to the display unit. Next, in step S220, the switch 151 is shifted to the terminal 'a'. Afterwards, in step S230, the resistance value of the variable resistor VR1 is adjusted. Further, in step S240, it is judged whether or not the LED 143 lightens; if the LED 143 lightens up, it goes back to step S230, where the resistance value of the variable resistor VR1 is adjusted again. If the LED 143 does not lighten in step S240, it proceeds to step S250, where a capacitor among the capacitor group in parallel connection in the object under test 125 is heated for altering the voltage V2. Furthermore, in step 260, the switch 151 is shifted to the terminal 'b', so that the comparator 130 accordingly changes the voltage difference for output corresponding to the altered voltage V2. Then, in step 270, it is judged whether or not the LED 143 lightens up for the display unit 140 to indicate a leakage current occurs; if the LED 143 lightens up, it proceeds to step S280, where the heated capacitor is identified as a defective capacitor and is replaced. If in step 270, the LED 143 does not lighten, it goes to step S290, where another capacitor is selected for heating and step S270 would be repeated.

Referring to FIGS. 1 and 2, when the output of the operation amplifier 141 is a negative voltage, the LED 143 would lighten. Note that the operation amplifier 141 and the resistors R8, R9, R10 and R11 together form a differential amplifier, therefore, if V3>V4, the output is a negative voltage output, which makes the LED 143 lighten. On the contrary, if V4>V3, the output is a positive voltage output, which makes the LED 143 fail to lighten.

At the beginning with the detecting, since the impedance amount of the capacitor group in parallel connection of the object under test 125 is unknown, the variable resistor VR1 thus is adjusted to the maximum extent of the resistance thereof for safety. Accordingly, in step S230, at the point where the switch 151 is connected to the terminal 'a', the adjusted over-high resistance of the variable resistor VR1 makes the voltage V2 larger than the voltage V1 and the comparator 130 would output a calibration voltage V3=+

Vcc and V3>V4, which makes the output of the operation amplifier 141 a negative voltage accompanied by the lightened LED 143. Thus, the resistance value of the variable resistor VR1 must be lowered by adjusting, so that the voltage V1>the voltage V2, the comparator 130 would output a calibration voltage V3=−Vcc, V3<V4, the output of the operation amplifier 141 is a positive voltage and the LED 143 does not lighten to accomplish the calibration.

In an embodiment of the present invention, the voltage V1 and the voltage V2 are respectively formed by a dividing voltage of the electrical bridge, where the voltage V1 is regulated by adjusting the variable resistor VR1. Besides, the display unit 140 uses the operation amplifier 141 to receive the voltage difference and produce a corresponding negative voltage for output, while the LED 143 is coupled with the negative voltage output to indicate whether or not the capacitor has leakage current.

In an embodiment of the present invention, the operation amplifier 141 of the method for detecting capacitor is able to employ a variable resistor VR2 to calibrate the voltage at the positive input terminal thereof, wherein the variable resistor is coupled with the input terminal of the operation amplifier 141 via a switch 151.

In summary, with the detecting fixture and the detecting method of the present invention, the working scheme is based on the characteristic that heating a capacitor with leakage current would lower the impedance thereof together with taking advantage of the circuit behaviors of the comparator, the operation amplifier and the LED thereof, therefore, the detecting fixture and the detecting method of the present invention are able to effectively and easily locate a capacitor for judging whether or not leakage current occurs with the capacitor.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A detecting fixture, used for detecting a capacitor with leakage current among a capacitor group in parallel connection; the fixture comprising:
   a reference voltage generator, used for outputting a first voltage;
   an impedance converter, used for converting the impedance of the capacitor group in parallel connection into a second voltage;
   a comparator, coupled with the output of the reference voltage generator and the output of the impedance converter, respectively; and
   a display unit, coupled with the output of the comparator, wherein when a thermal effect is applied to a capacitor among the capacitor group in parallel connection, the second voltage is altered and the comparator outputs a voltage difference corresponding to the altered second voltage, so that the display unit accordingly indicates whether or not a leakage current occurs;
   wherein the reference voltage generator has a first voltage divider, the impedance converter has a second voltage divider and the first voltage divider and the second voltage divider together form an electrical bridge.

2. The detecting fixture as recited in claim 1, wherein the first voltage divider has a variable resistor for adjusting the first voltage.

3. The detecting fixture as recited in claim 1, wherein the thermal effect applied to the capacitor is a heating effect.

4. A detecting fixture, used for detecting a capacitor with leakage current among a capacitor group in parallel connection; the fixture comprising:
   a reference voltage generator, used for outputting a first voltage;
   an impedance converter, used for converting the impedance of the capacitor group in parallel connection into a second voltage;
   a comparator, coupled with the output of the reference voltage generator and the output of the impedance converter, respectively; and
   a display unit, coupled with the output of the comparator, wherein when a thermal effect is applied to a capacitor among the capacitor group in parallel connection, the second voltage is altered and the comparator outputs a voltage difference corresponding to the altered second voltage, so that the display unit accordingly indicates whether or not a leakage current occurs;
   wherein the display unit has an operation amplifier coupled with the output of the comparator and the operation amplifier produces a negative voltage output in response to the voltage difference.

5. The detecting fixture as recited in claim 4, wherein the display unit further has an LED, the anode of the LED is grounded and the cathode thereof is coupled with the negative voltage output.

6. The detecting fixture as recited in claim 4, further comprising a calibration voltage generator coupled with the input terminal of the operation amplifier for producing a calibration voltage.

7. The detecting fixture as recited in claim 6, wherein the calibration voltage generator has a variable resistor for adjusting the calibration voltage.

8. The detecting fixture as recited in claim 7, further comprising a switch for connecting the variable resistor to the input terminal of the operation amplifier.

9. The detecting fixture as recited in claim 4, wherein the thermal effect applied to the capacitor is a heating effect.

10. A method for detecting capacitors, comprising:
    producing a first voltage;
    converting the impedance of a capacitor group in parallel connection into a second voltage and outputting the second voltage to a comparator;
    using the comparator to receive the first voltage and the second voltage and to output a comparison result to a display unit; and
    applying a thermal effect on a capacitor among the capacitor group in parallel connection to change the second voltage, wherein the comparator outputs a voltage difference in response to the altered second voltage, so that the display unit accordingly indicates whether or not the capacitor has leakage current;
    wherein the first voltage and the second voltage are produced by voltage-dividing an electrical bridge, respectively.

11. The method for detecting capacitors as recited in claim 10, wherein the electrical bridge uses a variable resistor to adjust the first voltage.

12. The method for detecting capacitors as recited in claim 10, wherein the step of applying the thermal effect on the capacitor is heating the capacitor.

13. A method for detecting capacitors, comprising:
producing a first voltage;
converting the impedance of a capacitor group in parallel connection into a second voltage and outputting the second voltage to a comparator;
using the comparator to receive the first voltage and the second voltage and to output a comparison result to a display unit; and
applying a thermal effect on a capacitor among the capacitor group in parallel connection to change the second voltage, wherein the comparator outputs a voltage difference in response to the altered second voltage, so that the display unit accordingly indicates whether or not the capacitor has leakage current;
wherein the display unit uses an operation amplifier to receive the voltage difference and accordingly produce a negative voltage output.

14. The method for detecting capacitors as recited in claim 13, wherein the display unit employs an LED to couple the negative voltage output for showing up whether or not the capacitor has leakage current.

15. The method for detecting capacitors as recited in claim 13, wherein the operation amplifier uses a variable resistor for calibrating the voltage at the positive input terminal thereof.

16. The method for detecting capacitors as recited in claim 15, wherein the variable resistor is connected to the input terminal of the operation amplifier via a switch.

17. The method for detecting capacitors as recited in claim 13, wherein the step of applying the thermal effect on the capacitor is heating the capacitor.

* * * * *